Figure 1:
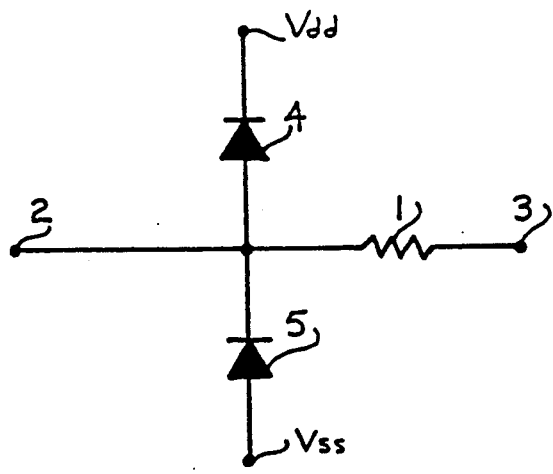

United States Patent [19]

Harris

[11] Patent Number: 5,218,506

[45] Date of Patent: Jun. 8, 1993

[54] PROTECTION OF ANALOG REFERENCE AND BIAS VOLTAGE INPUTS

[75] Inventor: Colin Harris, New Westminster, Canada

[73] Assignee: Mitel Corporation, Ontario, Canada

[21] Appl. No.: 458,295

[22] Filed: Dec. 28, 1989

[30] Foreign Application Priority Data

Feb. 1, 1989 [CA] Canada ................................. 589834

[51] Int. Cl.[5] .......................... H02H 3/20; H02H 9/04
[52] U.S. Cl. .......................................... 361/90; 361/56
[58] Field of Search ..................... 361/90, 91, 92, 56, 361/111; 357/23.13

[56] References Cited

U.S. PATENT DOCUMENTS

| | | | |
|---|---|---|---|
| 4,086,642 | 4/1978 | Yoshida et al. | 361/91 |
| 4,110,775 | 8/1978 | Festz | 357/15 |
| 4,385,337 | 5/1983 | Aszno | 361/91 |
| 4,860,148 | 8/1989 | Iwamura et al. | 361/58 |
| 4,922,371 | 5/1990 | Gray et al. | 361/91 |
| 4,930,037 | 5/1990 | Woo | 361/58 |
| 4,937,700 | 6/1990 | Iwahashi | 361/91 |

Primary Examiner—Steven L. Stephan
Assistant Examiner—D. R. Haszko
Attorney, Agent, or Firm—Antonelli, Terry, Stout & Kraus

[57] ABSTRACT

A latchup and electrostatic discharge protection circuit for an analog reference or bias voltage power supply input connected between an input power providing terminal of the power supply and a power rail of a CMOS integrated circuit having a parasitic latch device. The protection circuit comprised of three field effect transistors close-circuits a path from the power supply input to the power rail for normal power supply conditions and open-circuits the path for excessively positive and negative voltages at the power supply input, thereby safeguarding the CMOS integrated circuit from currents resulting from the excessive positive and negative voltages.

6 Claims, 2 Drawing Sheets

PROTECTION OF ANALOG REFERENCE AND BIAS VOLTAGE INPUTS

This invention relates to a latchup and electrostatic discharge protection circuit for an analog reference or bias voltage power supply input connected to a CMOS integrated circuit.

CMOS integrated circuits can contain parasitic bipolar devices associated with their output circuits and input protection circuitry. These parasitic devices can be interconnected in such a way as to form four-layer devices. In such cases, the parasitic four-layer bipolar devices sometimes called parasitic latch devices can become connected to the inputs of analog reference or bias voltage power supplies used with the CMOS circuits.

Parasitic latch devices are normally in their off states and will remain off as long as the absolute maximum ratings of the devices are not exceeded. In this state a latch device presents a very high impedance between the voltage rails of its power supply. The normal way that a parasitic latch device is turned on is by current being forced into the input or output of the CMOS circuit that incorporates it by the presence at such input or output of an excessive positive or negative voltage, known as an electrostatic discharge or EOS that exceeds the limits of the power supply. A positive feedback arrangement that exists within the parasitic latch device ensures that the latch device remains on even if the current is interrupted.

A parasitic latch device that is on is said to be in latchup. Latchup is defined as the creation of a stable low impedance path between two power supply rails. Since the latch device is switched into a low impedance state, large currents can flow through the CMOS circuit connected between the power supply rails. If there is no current limiting mechanism and correspondingly no mechanism to protect against excessive positive and negative voltages at the input of the power supply, the resulting high current can cause a conductive interconnection line that usually exists as part of the CMOS circuit to evaporate, destroying it. Thus protecting the input of an analog reference or bias voltage power supply from latchup and ESD is a major concern.

An analog reference or bias voltage power supply can be located as part of (on chip) or separate from (off chip) a CMOS circuit chip but must be filtered off chip since a capacitor needed for the power supply filter is typically too large to be placed on chip. Since an external capacitor is used to filter the power supply, any resistance in series with the input of the power supply must be small or else it would adversely affect the filtering effect of the capacitor. Prior art circuits used for protecting the input of an analog reference or bias voltage power supply against latchup and high voltage transients (ESD) utilized a resistor in series with the input and the capacitor. The present invention eliminates the resistor. Instead, a circuit is used that contains virtually no resistance, and therefore provides the advantage that there is virtually no adverse effect on the filtering by the power supply filter capacitor.

In a CMOS integrated circuit, resistors used in latchup and ESD protection circuits are difficult to fabricate, and therefore are costly. The present invention avoids the use of resistors entirely, thus substantially reducing cost.

In addition, designers of prior art latchup and ESD protection circuits required a knowledge of, and modification to, the internal circuitry nodes of the CMOS circuits to which the protection circuit was to be connected. A designer using the present invention requires no knowledge of, or modification to, the internal circuitry nodes of the CMOS circuits, yet still provides ESD and latchup protection to such circuitry, since it is separate from the CMOS circuits. The CMOS circuits can thus be designed optimally, without compromise to avoid the effect of latchup, because latchup caused by excessive positive or negative voltage at the power supply input substantially does not arise.

An embodiment of the present invention is a protection circuit for connection between an input power providing terminal of a power supply and a power terminal of a CMOS integrated circuit having a parasitic latch device. The protection circuit is comprised of at least one field effect transistor. The transistor's source-drain circuit is connected between the power supply input terminal and the power terminal of the CMOS circuit, and its gate is connected to a voltage supply terminal. The polarity of the voltage supply terminal is positive in the event the field effect transistor is of n-channel type and negative in the event the field effect transistor is of p-channel type. The source-drain circuit is biased on during a normal supply of current between the input terminal and the power terminal. An excessively high overvoltage appearing at the input terminal which is in the same polarity direction as the voltage supply biases the transistor into its non-conducting state, thereby safeguarding the CMOS integrated circuit from currents resulting from the overvoltage.

Another embodiment of the present invention is a latchup and ESD protection circuit for an analog reference or bias voltage power supply input terminal. The protection circuit is connected between the input terminal of the power supply and a power terminal of a CMOS integrated circuit. The protection circuit is comprised of an n-channel field effect first transistor and a p-channel field effect second transistor. The source and drain of the n-channel transistor is connected in series with the source and drain of the p-channel transistor. The gate of the n-channel transistor is connected to a positive voltage supply and the gate of the p-channel transistor is connected to a negative voltage supply. The drain or source of the first transistor not connected to the second transistor is connected to the power supply input terminal and the source or drain of the second transistor not connected to the first transistor is connected to the power terminal of the CMOS circuit.

Figure 2:
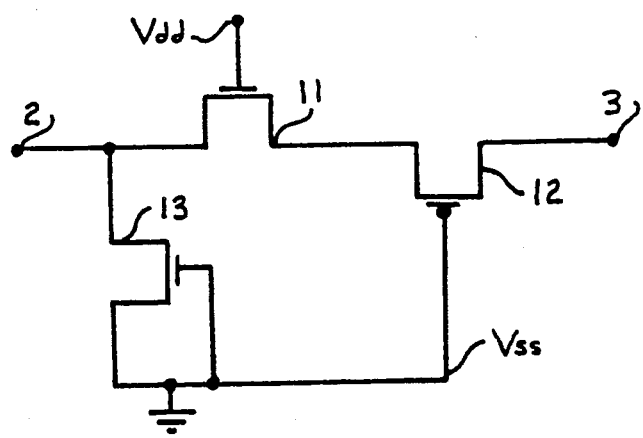
Figure 3:
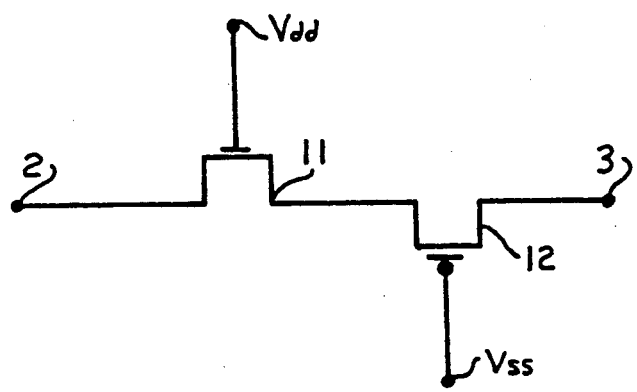
Figure 4:
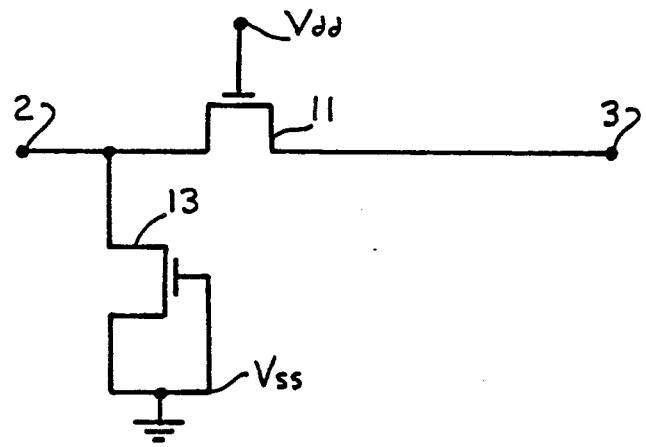
Figure 5:
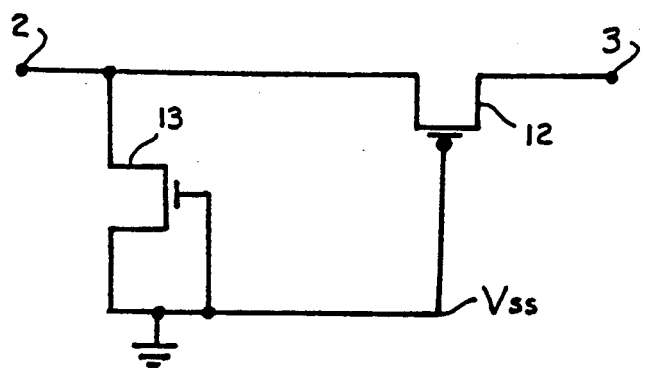

A better understanding of the present invention will be obtained by reading the description below in conjunction with the following drawings, in which:

FIG. 1 is a schematic diagram of a circuit used for latchup and ESD protection of an analog reference or bias voltage power supply input according to the prior art, FIG. 2 is a schematic diagram of a circuit used for latchup and ESD protection of an analog reference or bias voltage power supply input according to a preferred embodiment of the present invention, FIG. 3 is a schematic diagram of a circuit used for latchup and reduced ESD protection according to the present invention, FIG. 4 is a schematic diagram of a circuit used for overvoltage protection according to the present invention, and FIG. 5 is a schematic diagram of a circuit used for undervoltage protection according to the present invention.

FIG. 1 is a schematic diagram of a circuit used for latchup and ESD protection of well known form comprised of a resistor 1 in series with the reference or bias voltage power supply input power providing terminal 2 and an output terminal 3 to be connected to a power terminal of a CMOS circuit having a parasitic latch device, which must be protected from being latched on. A diode 4 has its anode connected to the input terminal 2 and its cathode connected to a positive voltage terminal $V_{dd}$ (typically at +5 volts). A diode 5 has its cathode connected to the input terminal 2 and its anode to ground (negative voltage $V_{ss}$).

In order to protect input terminal 2 from excessive positive and negative voltage (ESD), the pair of diodes 4 and 5 are connected between terminal 2 and $V_{dd}$ and terminal 2 and $V_{ss}$, respectively. The purpose of the diodes is to prevent a voltage present at input terminal 2 from rising above the supply voltage $V_{dd}$ (by more than one diode voltage drop) or falling below the ground voltage $V_{ss}$ (by more than one diode voltage drop).

Under normal circumstances, diodes 4 and 5 are reverse biased. However if an excessively positive voltage appears at terminal 2, diode 4 becomes forward biased, bypassing the input current to the supply $V_{dd}$. If an excessively negative voltage appears at terminal 2, diode 5 becomes forward biased, creating a conduction path to terminal 2 from the supply $V_{ss}$. While the diodes provide a low resistance path to the power supply terminals $V_{dd}$ and $V_{ss}$ for input voltages exceeding the aforenoted limits thus protecting the power supply input terminal 2, the input current flowing through resistor 1 is essentially zero. The diodes must be chosen so as to be able to handle the maximum current that can be drawn through input terminal 2.

To lower the probability of latchup, resistor 1 is used in series with the power supply input terminal 2 and output terminal 3. The resistor acts as a current limiting mechanism that diverts excessive current from flowing between input terminal 2 and output terminal 3. Excessive current is diverted into paths of less resistance within terminal 2 and terminal 3, i.e. to $V_{dd}$ or $V_{ss}$. Resistor 1 must have an appropriate resistance as to cause sufficient current to be diverted in order that excessive current does not flow between terminal 2 and terminal 3. As noted earlier, the creation of resistor 1 in a CMOS integrated circuit is both difficult and costly.

In addition, in the integrated circuit connected to terminal 3, each internal node which is sensitive to latchup must be surrounded by a strip of impurity diffusion or "guard ring". This is known in the prior art as guardbanding. n-Channel devices are surrounded by p+ doped diffused rings and p-channel devices by n+ doped diffused rings. These diffused rings are heavily doped areas which serve to prevent spurious field effect channel-type or bipolar leakage current conduction between elements of different devices which otherwise could produce unwanted leakage currents and which can trigger latchup.

According to an embodiment of the present invention, with reference to FIG. 2, three field effect transistors are used to provide latchup and ESD protection. An n-channel field effect pass transistor 11 has its source and drain connected in series with the source and drain of a p-channel field effect pass transistor 12. The source of transistor 11 is connected to the analog reference or bias voltage power supply input terminal 2. The drain of transistor 11 is connected to the source of transistor 12. The drain of transistor 12 is connected to the output terminal 3. The gate of transistor 11 is connected to $V_{dd}$ and the gate of transistor 12 is connected to $V_{ss}$. An n-channel transistor 13 has its drain connected to the power supply input terminal 2 and its gate and source connected to $V_{ss}$.

In operation, normally both the gates of transistors 11 and 12 are logically on and the gate of transistor 13 is logically off. Therefore, current will be conducted between input terminal 2 and output terminal 3 for normal power supply conditions. As a result, voltages in the range of the source-to-gate threshold voltage of transistor 12 and $V_{dd}$ minus the gate-to-source threshold voltage of transistor 11 will be present at output terminal 3. The drain-to-source channel resistance of transistors 11 and 12 must be appropriately selected to offer an appropriate input resistance for the analog reference or bias voltage power supply.

In the case of an overvoltage occurring at input terminal 2 which can cause a positive latchup condition in the integrated circuit connected to terminal 3, transistor 11 ceases to conduct current between its drain and source as its source voltage rises above its gate voltage, effectively biasing off the transistor. In the case of an undervoltage at terminal 2 which could cause a negative latchup condition in the integrated circuit connected to terminal 3, transistor 12 ceases to conduct current between its source and drain, as its source voltage becomes negative relative to its gate. The result is that excessive currents associated with over and undervoltages cannot pass through these two transistors, and circuits to be connected to input terminal 2 are thus protected.

To make the protection circuit connected between terminals 2 an 3 resistant to latchup, transistors 11 and 12 should be guardbanded. As noted earlier, nomodification is required to the internal nodes of the integrated CMOS circuit.

ESD protection is provided by transistors 11 and 13. Since the breakover voltage of transistor 13 is typically less than 10 volts, it provides a low resistance current conduction path for currents associated with voltage transients. Since transistor 13 has a direct connection to $V_{dd}$, it will pass most of the resulting energy. Since transistor 11 or 12 is nonconducting, any remaining energy related to the ESD transient is passed through the bipolar devices inherent in the structure of transistor 11 or transistor 12, which exhibits a very high resistance to current relative to the path through transistor 13. This type of structure has proved to be very effective for ESD protection.

Another embodiment of the present invention is shown in FIG. 3. FIG. 3 illustrates a circuit similar to that in FIG. 2, but with the deletion of transistor 13. Acceptable ESD protection levels are obtained even without transistor 13 since transistors 11 and 12 open circuit in the presence of an incoming ESD transient, as described earlier. The substrate of transistors 11 and 12 collect the current generated in this case.

According to a further embodiment of the present invention, shown in FIG. 4, transistor 12 is omitted from the structure described with reference to FIG. 2. In this case, latchup in the positive direction is avoided by means of transistor 11 providing a high impedance, when biased off due to positive overvoltage. The possibility of latchup in the negative direction remains but it is eliminated in the positive direction. Elimination of transistor 12 also increases the lower voltage range of the device from the source-to-gate threshold voltage of transistor 12 to $V_{ss}$.

Alternatively, transistor 11 may be omitted from the embodiment of FIG. 2, as shown in FIG. 5. In this case, latchup in the negative overvoltage direction is avoided by means of transistor 12 providing an open circuit when biased off due to negative overvoltage. The possibility of latchup in the positive overvoltage direction remains but it is eliminated in the negative overvoltage direction. Elimination of transistor 11 also increases the higher voltage range of the device from $V_{dd}$ minus the gate-to-source threshold voltage of transistor 11 to $V_{dd}$.

An advantage obtained by the use of the preferred embodiment is that the series resistance between the voltage supply input terminal 2 and the output terminal 3 is extremely small (virtually eliminated), since it is comprised merely of the source-drain channel resistance of either or both field effect transistors 11 and 12. Since the power supply to be connected to terminal 2 must be filtered with a capacitor in parallel with terminal 2 or terminal 3, the small resistance has the advantage that any reduction in the filtering effect of the capacitor is rendered to be minimal.

A further advantage obtained by the use of the perferred embodiment is that with respect to latchup protection, all the latchup protection circuitry is disposed within the protection circuit itself, thereby overcoming the disadvantage associated with prior art protection circuits wherein integrated CMOS circuits connected to terminal 3 required guardbanding of the transistors connected to its sensitive internal nodes to protect against latchup.

It may become clear to a person skilled in the art understanding this invention that numerous other embodiments or variations may be made thereto while not departing from the sphere and scope of this invention, as defined in the claims appended hereto.

I claim:

1. A protection circuit for connection between an input power providing terminal of a power supply and a power terminal of a CMOS integrated circuit having a parasitic latch device, comprising a first field effect transistor having its source-drain circuit connected between said input terminal and said power terminal, and its gate connected to a voltage supply terminal, the polarity of the voltage supply terminal being positive in the event the field effect transistor is of n-channel type and negative in the event the field effect transistor is of p-channel type whereby its source-drain circuit is biased on during normal supply of current from said input terminal to said power terminal, and wherein the polarity of an overvoltage appearing at said input terminal which is in the same polarity sense as the voltage supply biases said field effect transistor into its non-conducting state, thereby safeguarding the CMOS integrated circuit from currents resulting from the overvoltage, and a second field effect transistor having opposite channel type to said one field effect transistor having its source-drain circuit connected in series with the source-drain circuit of said one field effect transistor, and its gate connected to a voltage supply terminal having opposite polarity to that of the voltage supply terminal of said one field effect transistor wherein the polarity of an undervoltage appearing at said input terminal which is in the opposite polarity sense as said voltage terminal biases said second field effect transistor into its non-conducting state, thereby safeguarding the CMOS integrated circuit from currents resulting from the undervoltage.

2. A protection circuit as defined in claim 1, further including a bypass field effect transistor having its source and drain connected between said input terminal and said voltage supply and its gate and source connected together, the polarity of the voltage supply to which it is connected being negative where the bypass transistor is of n-channel type and being positive where the bypass transistor is of p-channel type.

3. A protection circuit as defined in claim 1, further including a bypass field effect transistor having its source and drain connected between said input terminal and said voltage supply and its gate and source connected together, the polarity of the voltage supply to which it is connected being negative where the bypass transistor is of n-channel type and being positive where the bypass transistor is of p-channel type and a guardband surrounding each of the first and second field effect transistors for substantially impeding leakage currents that may pass through the first and second transistors.

4. Latchup and electrostatic discharge protection means for an analog reference or bias voltage power supply input connected between a CMOS integrated circuit and said voltage input, comprised of an n-channel field effect first transistor and a p-channel field effect second transistor, the source and drain of the n-channel transistor being connected in series with the source and drain of the p-channel field effect transistor, the gate of the n-channel field effect transistor being connected to a positive voltage supply and the gate of the p-channel field effect transistor being connected to a negative voltage supply, the drain or source of one transistor not connected to the other being connected to said voltage input and the source or drain of the other transistor not being connected to said one transistor being connected to the said CMOS circuit.

5. Protection means as defined in claim 4, further comprised of an n-channel field effect third transistor having its source and gate connected to a negative voltage supply and its drain connected to the said voltage input.

6. Protection means as defined in claim 4 or 5, further including a guardband surrounding each of the first and second transistors for substantially impeding leakage currents which may pass through either of the first and second transistors.

* * * * *